United States Patent [19]

North et al.

[11] 4,210,923
[45] Jul. 1, 1980

[54] EDGE ILLUMINATED PHOTODETECTOR WITH OPTICAL FIBER ALIGNMENT

[75] Inventors: James C. North, New Providence; David P. Schinke, Berkeley Heights, both of N.J.

[73] Assignee: Bell Telephone Laboratories, Incorporated, Murray Hill, N.J.

[21] Appl. No.: 71

[22] Filed: Jan. 2, 1979

[51] Int. Cl.² .................................. H01L 27/14
[52] U.S. Cl. ............................ 357/30; 357/55; 357/60; 350/96.17
[58] Field of Search ................ 357/55, 30, 60; 350/96.11, 96.14, 96.17

[56] References Cited

U.S. PATENT DOCUMENTS

| | | | |
|---|---|---|---|
| 3,646,407 | 2/1972 | Meuleman | 317/234 R |
| 3,774,987 | 11/1973 | Boivin | 350/96 WG |
| 3,952,265 | 4/1976 | Hunsperger | 331/94.5 H |
| 3,994,559 | 11/1976 | Crow | 350/96 C |
| 4,083,062 | 4/1978 | Ohuchi | 357/13 |
| 4,110,781 | 8/1978 | Konishi | 357/39 |
| 4,137,543 | 1/1979 | Beneking | 357/30 |

OTHER PUBLICATIONS

Conradi et al, *I.E.E.E. Trans. on Electron Devices*, vol ED-25, No. 2, Feb. 1978.

*Primary Examiner*—Martin H. Edlow
*Attorney, Agent, or Firm*—Lester H. Birnbaum

[57] ABSTRACT

A silicon photodetector capable of long wavelength response which includes means for aligning an optical fiber for edge illumination. The detector is formed in a silicon body (11 and 12) with major surfaces lying in the (110) plane. A groove (23) is etched in the body adjacent the detector to produce sidewalls (24) and an end wall (25) lying in (111) planes. The sidewalls form a v-shaped groove with a depth precisely determined by the width of the groove so that an optical fiber (26) placed in the groove is vertically aligned with the detector. The end wall is perpendicular to the surface of the body so that light from the fiber is not refracted from the plane of the detector.

9 Claims, 3 Drawing Figures

EDGE ILLUMINATED PHOTODETECTOR WITH OPTICAL FIBER ALIGNMENT

BACKGROUND OF THE INVENTION

This invention relates to optical detectors useful for lightwave communications, and in particular to a monolithic silicon photodetector which includes means for aligning an optical fiber for edge illumination of the detector.

Lightwave communication systems are currently enjoying an intensive development effort. In the present technology generally, silicon photodetectors are utilized to detect light produced by GaAlAs lasers at a wavelength of approximately 0.85 microns. The photodetectors are usually p-i-n or avalanche diodes which are illuminated through the top surface of the device (see, for example, Melchior, "Detectors for Lightwave Communication," *Physics Today*, Volume 30, pages 32-39 (November 1977)). While such systems are more than adequate, it is recognized that an increase in distance between repeaters over that presently available is highly desirable for more economical systems. This presently requires use of light at longer wavelengths.

Fiber attenuation in available fibers decreases as the wavelength of light increases and it is therefore desirable to provide devices which can detect the longer wavelengths. Presently available top-illuminated photodetectors are generally limited to the 0.8–0.9μ range since the detectable light absorbing region, which is defined by the depth of the depletion region in the device, is shallow and does not provide sufficient distance for light of longer wavelengths to be absorbed therein. That is, at wavelengths beyond 0.9 μm, the quantum efficiency of conventional top-illuminated silicon detectors drops off rapidly due to the decrease in absorption coefficient with wavelength (see, e.g., Conradi, "Fiber Optical Transmission Between 0.8 and 1.4 μm", *IEEE Transactions on Electron Devices*, Vol. ED-25, No. 2, pp. 180-191 (February 1978)).

If one wishes to provide detectors which can operate above 0.9 μm, one has basically two alternatives: to construct special silicon detectors capable of absorbing and detecting light at longer wavelengths or to develop detectors in other material such as germanium and alloys of III-V compounds. Considerable effort is now being made in the latter approach since fiber attenuation in available fibers is minimized at a wavelength of approximately 1.3 μm and absorption in silicon is limited to approximately 1.1 μm due to its small bandgap (1.12 eV).

There are, however, definite advantages in retaining silicon as a photodetector material. These include the fact that silicon technology is well developed, the material has a greater inherent sensitivity than other materials being explored, and it permits integrating the detector with other elements on the same chip. It is possible to construct silicon photodetectors which are responsive to wavelengths of 1.0-1.1 μm and therefore permit lower fiber attenuation while retaining silicon as the detector material. This construction basically involves making the optical path length longer than the diode depletion depth to accommodate the absorption requirements of the longer wavelengths. This can be accomplished, for example, by illuminating the detector at an edge so that light travels parallel to the device surface. This defines the detectable light absorbing region by the length of the depletion region which is considerably greater than the depth. However, since the thickness of the depletion region in the detector is very small, the vertical alignment of the fiber becomes critical. Alignment by normal mechanical means therefore becomes very difficult.

It is therefore a primary object of the invention to provide a silicon detector structure which is responsive to light at long wavelengths and includes means for precise alignment of the fiber with the detectable light absorbing region of the detector.

SUMMARY OF THE INVENTION

This and other objects are achieved in accordance with the invention. The detector comprises a body of silicon with two major surfaces and means formed in the body responsive to light which is incident on the body essentially parallel to the surfaces. The major surfaces lie in the (110) plane. A groove is formed adjacent to the light responsive means. The groove has sloping sidewalls lying in (111) planes which make the groove suitable for placing an optical fiber therein aligned with the area under the light responsive means. The groove also includes an end wall lying in a (111) plane which is perpendicular to the major surfaces so the light, upon entering the silicon body, remains parallel to the major surfaces.

BRIEF DESCRIPTION OF THE DRAWING

These and other features of the invention are delineated in detail in the following description. In the drawing.

It will be realized that for purposes of illustration, these figures are not necessarily drawn to scale.

DETAILED DESCRIPTION OF THE INVENTION

The invention will be described with reference to a particular device illustrated in FIGS. 1-3. Although a single device is shown, it should be realized that an array of detectors can be formed in the silicon body to receive light from a plurality of fibers. In addition, other types of devices may also be integrated in the same chip.

Figure 1:
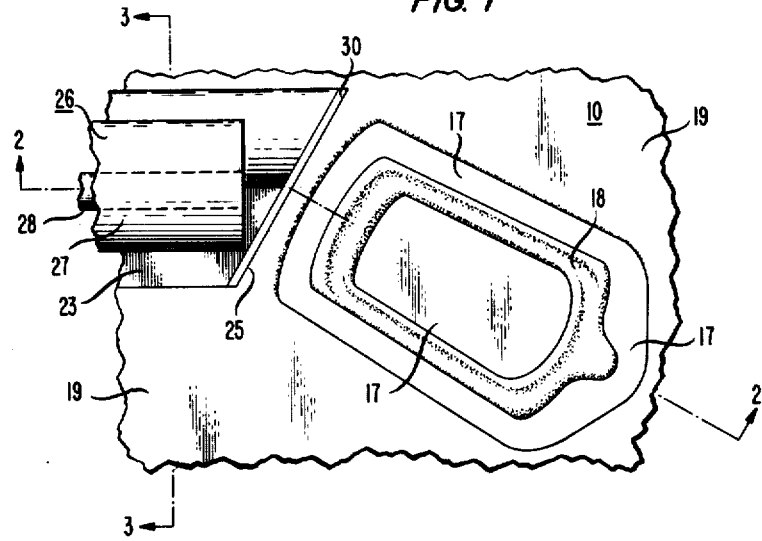
FIG. 1 is a plan view of a device in accordance with one embodiment of the invention.
Figure 2:
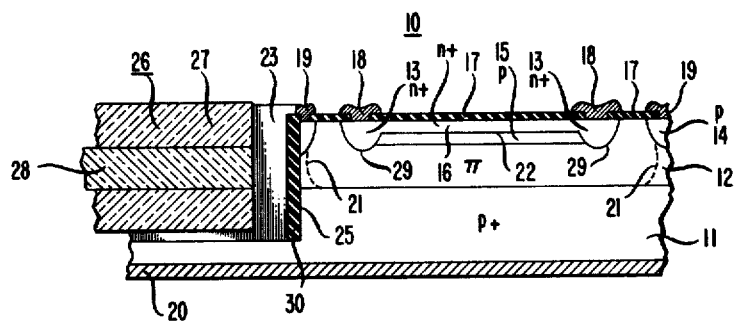
FIG. 2 is a cross-sectional view along line 2—2' of FIG. 1.
Figure 3:
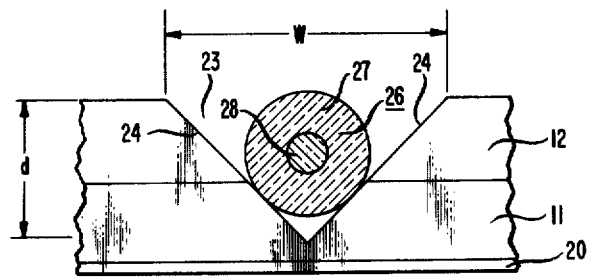
FIG. 3 is a cross-sectional view along line 3—3' of FIG. 1.

As illustrated in FIGS. 1-3, the detector, 10, is formed in a body of silicon which includes substrate or bulk portion 11 and epitaxial layer 12. The major surfaces of the body lie in the (110) planes for reasons to be discussed later. The particular detector shown here is a known form of avalanche photodiode which has been described for example, in Melchior, "Detectors for Lightwave Communication," *Physics Today*, Volume 30, pages 32-39 (November 1977). It should be realized that this detector is illustrative, and the invention may be used with any silicon detector having light responsive means capable of detecting light incident essentially parallel to the major surfaces of the device.

In this example, the silicon substrate is doped to form a p+ conductivity region with a resistivity of approximately 0.1 ohm-cm. Formed on the silicon substrate is an epitaxial silicon layer, 12, which is also p conductivity type but with a low impurity concentration and therefore designated "π". The impurity concentration of this layer is typically less than 10$^{14}$ cm$^{-3}$ and the layer is approximately 50–100 μm thick.

The detector illustratively is fabricated by first forming a guard ring comprising n+-type region, 13, and then forming a channel stop comprising p-type region, 14, both by standard diffusion techniques. Each region typically has an impurity concentration of greater than 10$^{19}$ cm$^{-3}$. The guard ring eliminates breakdown around the periphery of the n+-p junction formed later, and the channel stop surrounds the device and prevents surface inversion. The depth of the guard ring is typically 6–8 μm and that of the channel stop is 2–3 μm. A p-type region, 15, is then formed, typically, by implanting boron in the region surrounded by the guard ring and then diffusing to a depth of approximately 4–6 μm. The impurity concentration of this region is typically approximately 10$^{16}$ cm$^{-3}$. A shallow n+ region, 16, is then formed, advantageously by ion implantation and diffusion, in the same area as the p region for a time adjusted to control the particular current-gain-voltage characteristic of the device. Typically, the depth is approximately 0.5 μm and the concentration is greater than 10$^{19}$ cm$^{-3}$. Insulating layer, 17, is formed on one major surface to passivate the device. This layer is usually a multi-layer of SiO$_2$ and Si$_3$N$_4$. Metallization, 18, forms a contact to the N+ region, and field plate electrode 19 is formed over the channel stop region. It will be noted that the metal overlaps the n-π and p-n+ junctions to prevent the buildup of charge within and at the surface of the insulating layers near the edge of the junctions. Metal layer, 20, formed on the opposite surface of the body provides contact to the p+ substrate.

The photo-responsive means in the device is the n+-p junction 22 and the n+-π junction 29. That is, light-generated carriers in the vicinity of the junctions will induce a current across the junctions. In operation, when a reverse bias is supplied to the junctions, a depletion region indicated by dashed line 21 will be formed through the entire thickness of the epitaxial layer 12. Light incident on the semiconductor will be absorbed and produce hole-electron pairs. As long as the light is absorbed in the depletion region, the holes and electrons will be separated by the electric field and electrons will flow across the junctions and be collected in n+ region (16) while holes will flow to the back contact (20) to consistute a current across the device. For avalanche photodiodes, a sufficiently high reverse bias is supplied so that the electrons gain sufficient energy to release new electron-hole pairs by impact ionization in the p region 15 and gain is achieved provided the light is absorbed in the area under the p-n+ junction 22. That is, electrons generated in the region under the p-n+ junction 22 (designated the active region) will be multiplied, while those generated outside the active region but in the depletion region will be detected by the n+-π junction but not multiplied. In any event, since the lengths of the depletion region and the active region are considerably greater than the depth of the depletion region, a longer path length is available for detection of absorbed light if light is incident on the edge of the device so the light is parallel to the device surface. This longer path length therefore accommodates the higher absorption coefficient of longer wavelength light so that light of 1.0–1.1 μm can be detected.

Sometime after the formation of the epitaxial layer, 12, and preferably after the formation of the n and p regions previously described, a groove 23 is etched through the layer 12 and extending into the substrate 11.

An appropriate masking material such as thermally grown SiO$_2$ can be used to define the boundaries of the groove. The (110) crystal orientation of the major surface of the body and the orientation of the mask is such as to produce sidewalls 24 and an endwall 25 lying in (111) planes. The groove is anisotropically etched so that the silicon is etched very rapidly in the (110) direction, but very slowly in the (111) directions. This can be accomplished, for example, with a solution of KOH and water at a temperature of approximately 70 degrees C. which etches at a rate of approximately 1 μm/min in the (110) direction and at an imperceptable rate in the (111) direction. (For a detailed discussion of etching grooves utilizing this crystal orientation for dielectric isolation in integrated circuits, see U.S. patent application of A. R. Hartman, et al, Ser. No. 849,788, filed Aug. 25, 1978.)

The resulting groove, as shown in FIG. 3, has sloping sidewalls which produce an angle of approximately 35 degrees with respect to the wafer surface. Etching in this orientation is self-limiting and the depth of the groove, d, is determined solely by the width of the groove, w, according to the relationship:

$$d = W/2\sqrt{2}$$

An optical fiber 26 is placed in the groove. The fiber comprises an outer cladding 27 and inner core 28 through which the light is transmitted as well known in the art. The width of the groove is chosen to produce the proper depth for vertical alignment of the fiber core with the portion of the depletion region 21 beneath the surface regions 13, 14, 15 and 16. For a typical optical fiber having a 55 μm core diameter, and a 110 μm cladding diameter, a groove whose width is 360 μm would provide proper alignment by positioning the top of the fiber core approximately 10 μm below the top major surface. Of course, these dimensions are only illustrative and grooves of appropriate widths can be chosen to accommodate other sizes of fibers and detectors. For example, the dimensions can be suitably reduced to accommodate single mode fibers which typically have a core diameter of 5–10 μm.

One of the significant advantages of utilizing grooves with this orientation is the formation of the end wall 25 (see FIG. 2). This wall is perpendicular to the major surface of the device. Thus, light from the fiber, upon entering the semiconductor layer 12, will remain parallel to the major surface and will not be refracted out of the detector. Other structures have been proposed wherein a fiber is placed in a V-groove to couple light into or out of a waveguide formed on the surface of a semiconductor body (see, for example, U.S. Pat. Nos. 3,774,987 and 3,994,559). With the present invention, however, light can be coupled directly into the semiconductor to permit a monolithic structure.

It will be noted that the fiber axis forms an angle of approximately 35 degrees with respect to the normal to the end wall (25) (See FIG. 1). Advantageously, the fiber is placed so that a portion of the end of the fiber contacts the end wall. In this example, the portion of the fiber end farthest from the wall is approximately 78 μm from the wall. The dimensions of the active region and the placement of the groove with respect thereto can be determined for a particular device on the basis of a light ray analysis of the cones of light emanating from the ends of the fiber core in a plane parallel to the device surface. The active region should preferably be long enough to achieve good absorption efficiency but as small as possible to minimize device capacitance and maximize yield of good devices. In this example, the length is approximately 700 μm. The region is also advantageously tapered so that the width is greater farther from the end wall 25 to accept the light which diverges from the fiber end. In this example, with a fiber having a numerical aperture 0.23, the width of the region ranges from approximately 250μ at the end nearest the groove to approximately 300μ at the opposite end.

The vertical end wall has a reflectivity of approximately 30 percent. Thus, if desired, the reflectivity could be reduced by depositing an anti-reflection coating, 30, such as $Si_3N_4$, on the end wall. Such a layer would be, typically, approximately 1400 Angstroms thick.

The device structure in accordance with the invention offers significant advantage in quantum efficiency for wavelengths in the range of approximately 1.0–1.1 μm. The etched v-groove permits easy alignment of the optical fiber. The vertical end wall of the groove allows the fiber to be mounted with its light-emitting core in the plane of the device chip thus permitting a monolithic detector structure.

It will be realized that several alternative embodiments are possible. For example, all polarities described with reference to the detector could be reversed. In addition, other detector structures such as a p-i-n photodiode may be used in accordance with the invention. Further, the detector portion could be fabricated as a dielectrically isolated region in a polysilicon substrate. Such a structure may be advantageous in providing internal reflection of the incident light (see, for example, U.S. Pat. No. 3,994,012).

Various additional modifications will become apparent to those skilled in the art. All such variations which basically rely on the teachings through which the invention has advanced the art are properly considered within the spirit and scope of the invention.

We claim:

1. A semiconductor device for detection of incident light comprising a body of silicon (11 and 12) with two major surfaces and means (22 and 29) formed in said body responsive to light which is incident thereon essentially parallel to said major surfaces characterized in that the major surfaces lie in the (110) plane and a portion of the semiconductor body defines a groove (23) adjacent to said light responsive means, said groove having sloping sidewalls (24) lying in (111) planes suitable for placing an optical fiber in the groove aligned with the area under said light responsive means.

2. The device according to claim 1 wherein the groove further comprises an end wall (25) lying in a (111) plane perpendicular to said major surfaces.

3. The device according to claim 2 further comprising an anti-reflection coating (30) formed on the surface of said end wall.

4. The device according to claim 1 wherein the width of the light responsive means is varied so as to be wider at distances farther from the groove.

5. The device according to claim 1 further comprising an optical fiber placed in said groove so that light from said fiber is incident on said body essentially parallel to the major surfaces.

6. The device according to claim 1 wherein the silicon body includes a substrate and an epitaxial layer formed thereon, and the light responsive means includes a p-n junction formed in said epitaxial layer.

7. The dvice according to claim 6 wherein the device is capable of producing gain by multiplying carriers generated in response to light in the area below said p-n junction.

8. The device according to claim 6 wherein the device further includes a guard ring formed at the surface of the epitaxial layer surrounding said p-n junction and a channel stop region formed at the surface of the epitaxial layer on the periphery of said device.

9. A semiconductor device for detection of incident light comprising a body of silicon with two major surfaces and including a substrate (11) of one conductivity type and an epitaxial layer (12) of the same conductivity type but lower impurity concentration, a first region (16) of opposite conductivity type formed at the surface of said epitaxial layer, a second region (15) of said one conductivity type but higher impurity concentration than said epitaxial layer formed beneath said first region so as to form a p-n junction (22) which is responsive to carriers generated in said epitaxial layer in response to light incident thereon parallel to the major surface, and a guard ring (13) of opposite conductivity type surrounding said p-n junction CHARACTERIZED IN THAT the major surfaces lie in the (110) plane, a portion of the semiconductor body defines a groove (23) adjacent to one side of the p-n junction, said groove having sloping sidewalls (24) lying in (111) planes and an end wall (25) lying in a (111) plane perpendicular to the major surfaces, the width of the p-n junction is varied so as to be wider at distances farther from the groove, and an optical fiber is placed in said groove so that light from said fiber is incident on said epitaxial layer beneath the first and second regions essentially parallel to the major surfaces.

* * * * *